United States Patent [19]

Gutbier et al.

[11] 4,345,814

[45] Aug. 24, 1982

[54] SOLDER-BEARING LEAD HAVING SOLDER FLOW-CONTROL STOP MEANS

[75] Inventors: Ernst A. Gutbier, North Andover; Paul J. Ouellette, Amesbury, both of Mass.

[73] Assignee: Western Electric Company, Inc., New York, N.Y.

[21] Appl. No.: 231,569

[22] Filed: Feb. 4, 1981

[51] Int. Cl.³ .............................................. H01R 9/06
[52] U.S. Cl. .............................................. 339/275 R
[58] Field of Search ............. 339/17 C, 17 L, 17 LC, 339/258 R, 258 P, 275 R, 275 B, 275 T

[56] References Cited

U.S. PATENT DOCUMENTS

| | | | |
|---|---|---|---|
| 3,249,910 | 5/1966 | Venn et al. | 339/275 B |
| 3,351,704 | 11/1967 | Sitzler | 174/84 |
| 3,750,252 | 8/1973 | Landman | 29/191.6 |
| 3,827,918 | 8/1974 | Ameen et al. | 117/6.2 |
| 3,864,004 | 2/1975 | Friend | 339/275 B |
| 4,019,803 | 4/1977 | Schell | 339/275 B |
| 4,034,471 | 7/1977 | Bias | 29/629 |
| 4,085,998 | 4/1978 | Owens | 339/275 B |
| 4,120,558 | 10/1978 | Seidler | 339/275 T |
| 4,203,648 | 5/1980 | Seidler | 339/275 T |

*Primary Examiner*—Joseph H. McGlynn
*Attorney, Agent, or Firm*—D. D. Bosben

[57] ABSTRACT

A solder-bearing lead (10) is provided with solder flow-control stops (20 and 22) on opposite surfaces of a contact finger (18) closely adjacent a flux-bearing solder preform (12) on the contact finger, to preclude flow of molten solder from the solder preform along the contact finger to a stem (26) of the lead in a soldering operation. The first solder flow-control stop (20) forces the molten solder to flow directly across sides of the contact finger (18) to a contact pad (14), where it is confined by the second solder flow-control stop (22) to form a soldered connection (24) in a reduced time period and without the necessity for any significant supplemental fluxing. Additional solder flow-control stops (38 and 40) also are formed on resilient spring clamping fingers (28) of the lead. The solder flow-control stops (20, 22, 38 and 40) are formed by oxidized portions of a phosphor bronze base metal from which portions of solder-wettable tin coatings (42 and 44) have been removed.

10 Claims, 3 Drawing Figures

SOLDER-BEARING LEAD HAVING SOLDER FLOW-CONTROL STOP MEANS

TECHNICAL FIELD

This invention relates to a solder-bearing lead having solder flow-control stop means, and more particularly to a solder-bearing lead having solder-confining stops formed on opposite surfaces of a solder preform-carrying contact finger closely adjacent the solder preform.

BACKGROUND OF THE INVENTION

A solder-bearing lead is known in which the lead includes opposed resilient clamping fingers at one end of an elongated stem, with at least one of the fingers defining an electrical contact. The clamping fingers include opposed inner surfaces which define a gap for the reception of a rigid substrate circuit device therebetween, such that the inner surface of the electrical contact clamping finger engages a contact pad on the substrate circuit device. On an outer opposite surface of the contact clamping finger, the contact clamping finger carries a solder preform. The solder preform, upon being temporarily subjected to heat in a soldering operation, initially melts and flows over opposite sides of the contact finger onto the contact pad, and then resolidifies to bond the lead to the contact pad. Solder-bearing leads of this type are shown in the U.S. Pat. Nos. 4,019,803 to M. S. Schell, and the U.S. Pat. Nos. 4,120,558 and 4,203,648 to J. Seidler.

Solder-bearing leads as above described normally are fabricated in strip form in a progressive punch-and-die from a strip of phosphor bronze base metal which has been provided with thin tin coatings on opposite sides thereof, to facilitate the subsequent making of electrical connections to the leads. During the lead fabrication process in the progressive punch-and-die, a continuous solder wire is attached to the contact fingers of the leads and subsequently clipped between the leads to form the solder preforms on the leads. Further, during the lead fabrication process the stems of the leads are formed integrally connected to an elongated continuous support rail which subsequently is clipped from the stems after the leads have been mounted on a substrate circuit device and soldered to respective contact pads on the device.

In soldering the leads after they have been mounted on their respective substrate circuit devices, a plurality of the resultant lead-substrate circuit device assemblies initially are sprayed with a suitable flux in a fluxing chamber and then positioned in a vapor condensation mass soldering apparatus. In this apparatus, the assemblies are conveyed into a vapor condensation soldering chamber where a heated vapor from a boiling working fluid condenses on the surfaces of the assemblies and quickly heats the assemblies to cause melting of the solder preforms on the leads and soldering of the leads to their respective contact pads. Generally, a primary working fluid which is a relatively expensive high boiling, thermally stable, nonflammable fluorinated organic compound, known as Flourinert FC-70 and having the composition $(C_5F_{11})_3N$, is used. In addition, to prevent loss of the expensive primary working fluid by diffusion into the atmosphere, a vapor blanket formed from a less expensive chemically inert secondary fluid, known as refrigerant FC-113 and having the composition $F_2ClCCFCl_2$, is frequently used.

The use of spray fluxing for soldering purposes as above described is disadvantageous for a number of reasons. For example, where rosin flux is used, as is common practice, a carbonaceous deposit builds up on the surfaces of immersion heaters used to produce the condensation soldering vapors, causing undesirable overheating of the heaters and thermal degradation of the primary and secondary fluids. The thermal degradation of the primary working fluid can produce a build up of hydroflouric acid in the system, which causes undesirable etching of the metal parts of the apparatus and the lead-substrate circuit device assemblies. Similarly, the thermal degradation of the secondary fluid, in the presence of organic matter, such as the soldering flux, can produce a build up of hydrochloric acid, with similar effects. In addition, the thermal decomposition of the primary working fluid may produce a toxic gas, such as perflouroisobutylene, which becomes dissolved in the working fluid. The thermal decomposition of the secondary fluid also may produce a toxic gas, such as phosgene. Under very high acid conditions in larger condensation soldering facilities, the thermal degradation of the primary working fluid also can cause the deposition of a white crystalline material (perfluorobutylamide) on cool surfaces in the apparatus.

As a net result, the use of rosin flux in the soldering operation produces conditions which cause the soldering apparatus to require frequent maintenance, cleaning, repair and/or replacement of parts. In addition, it is desirable that recovered primary working fluid be routinely filtered to remove rosin and rosin residues before the fluid is recycled into the apparatus for reuse. Further, to avoid a build up of hydrofluoric and hydrochloric acids in the system, it is necessary to chemically neutralize these acids on a continuous basis by passing the recovered primary and secondary fluids through a chemical filter, such as soda lime, before reintroducing the fluids back into the system. Continuous care and monitoring also must be exercised and correct operating procedures observed to preclude the build up of the above-mentioned undesirable toxic gases (perfluoroisobutylene or phosgene) in the system.

In view of the foregoing, it has been proposed that the solder preforms on the solder-bearing leads be of a flux-bearing type, such as rosin core solder, to eliminate, or at least reduce, the spray fluxing of the leads, and thereby reduce the amount of solder flux which is introduced into the vapor condensation soldering system and deposited on other parts of the substrate circuit devices. It has been found, however, that because of physical limitations in the size of the solder preforms, sufficient flux cannot be incorporated into the preforms to produce satisfactory soldered connections between the leads and the substrate contact pads. In accordance with the theory of this invention, this inability to form proper soldered connections with flux-bearing solder preforms in the past is attributed to the fact that the melted solder preforms tend to flow along the lead contact fingers to the stems of the leads, then along the stems, and then in a reverse direction to the contact pads, rather than directly across the sides of the contact fingers down onto the contact pads. As a result, the fluxing capability of the flux in the solder preforms has been dissipated by the time the molten solder reaches the contact pads and the solder cannot form proper soldered connections without significant supplemental fluxing.

The affinity for the melted solder preforms to flow along the contact fingers and the stems of the leads as noted above also is disclosed in the copending patent application Ser. No. 231,568, assigned to the same assignee as the subject application, filed on even date herewith in the name of C. J. Milora, and entitled "Solder-Bearing Lead Having Solder-Confining Stop Means." In this regard, the C. J. Milora application discloses the providing of solder stops on the stems of the leads to preclude flow of the molter solder along the stems to narrow portions thereof which subsequently form soldered connections with circuit paths on a printed circuit board. It has been found, however, that solder stops located in this manner do not facilitate the use of flux-bearing solder preforms without supplemental spray fluxing prior to the soldering operation.

Accordingly, a primary purpose of this invention is to provide a new and improved solder-bearing lead in which flow of molten solder from a solder preform on a lead contact finger is controlled so that the molten solder flows directly down onto an associated contact pad on a substrate circuit device to form a satisfactory soldered connection, whereby the solder preform may be of a flux-bearing type which forms the soldered connection without any significant supplemental fluxing.

SUMMARY OF THE INVENTION

In general, a solder-bearing lead comprises an elongated stem and first and second resilient clamping fingers extending in opposed spaced relationship from the elongated stem to define a gap for the reception of a substrate therebetween, with the first clamping finger defining an electrical contact having a first surface for engaging a contact pad on the substrate. A solder mass is attached to a second opposite surface of the electrical contact finger, and a solder flow-control stop is formed on the second surface of the contact finger closely adjacent the solder mass for precluding flow of molten solder from the solder mass along the contact finger during a soldering operation, thus forcing the molten solder to flow directly across at least one side of the finger to the first surface of the contact finger and onto the contact pad to form a soldered connection.

More specifically, the lead stem and the resilient clamping fingers are formed from a base metal which is coated on first and second opposite surfaces thereof with a metal which is readily wetted by solder. The first solder flow-control stop and a second solder flow-control stop are formed on respective ones of the opposite surfaces of the contact finger by oxidized portions of the base metal. The second solder flow-control stop precludes flow of the molten solder along the contact finger from the substrate contact pad during the soldering operation. The second clamping finger also may have solder flow-control stops formed thereon to preclude flow of molten solder from the solder mass to the lead stem. Preferably, the solder mass is a flux-bearing type solder preform to eliminate the need for supplemental fluxing.

DETAILED DESCRIPTION

Figure 1:
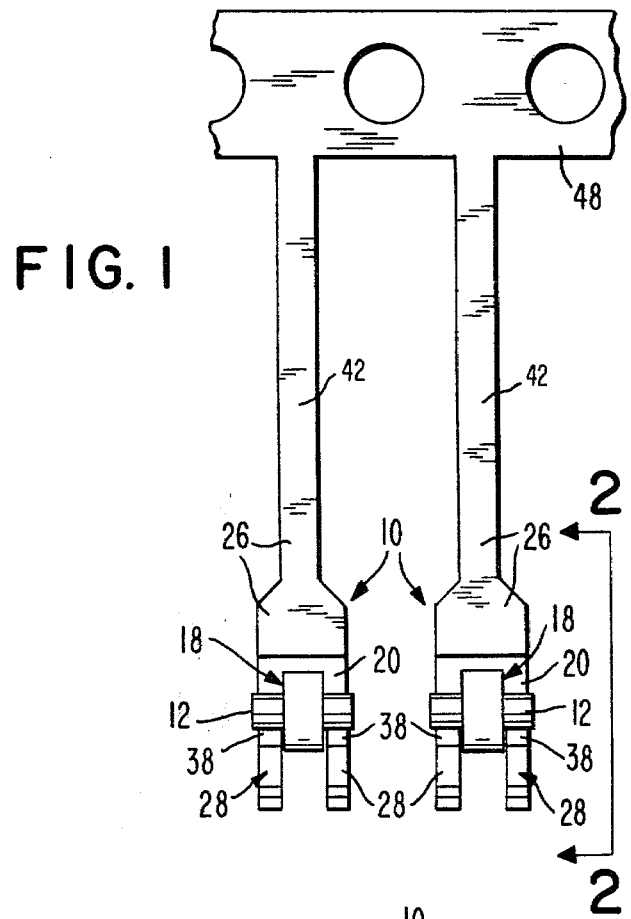
FIG. 1 is an elevational view of a portion of a strip of solder-bearing leads in accordance with the invention.
Figures 2, 3:
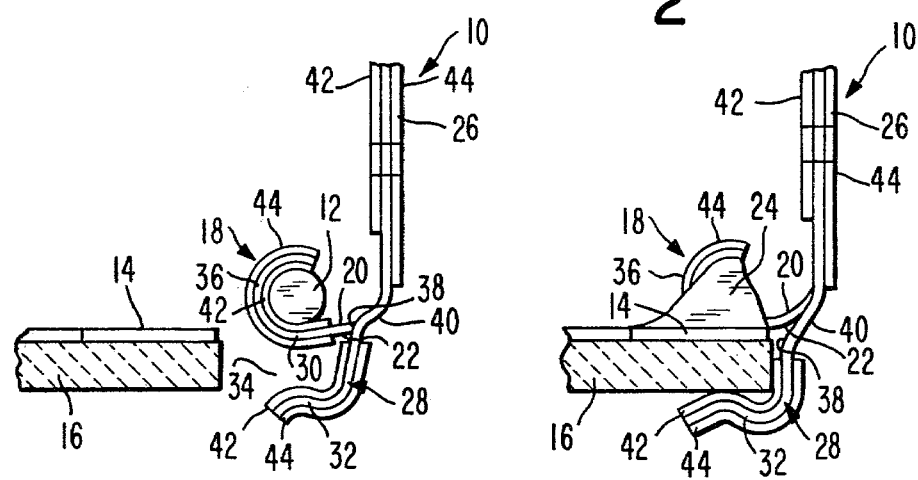
FIG. 2 is a partial side view of a solder-bearing lead in accordance with the invention, looking in the direction of the arrows 2—2 in FIG. 2.
FIG. 3 is a view similar to FIG. 2, showing the solder-bearing lead thereof after the lead has been assembled and soldered to a substate circuit device.

Referring to FIGS. 1, 2 and 3, the invention as disclosed in these figures is directed to a solder-bearing lead 10 of a type wherein each lead carries a mechanically clamped solder mass or preform 12 (FIGS. 1 and 2) for bonding the lead to a respective contact pad 14 (one shown in FIGS. 2 and 3) on a rigid substrate circuit device 16. More specifically, the solder preform 12 is carried on an outer surface of a central contact finger 18 of the lead 10 with opposite end portions of the preform projecting in a cantilevered fashion from opposite sides of the contact finger. In accordance with this invention, the central contact finger 18 of each lead 10 also includes solder flow-control stops 20 and 22 formed on opposite surfaces of the contact finger adjacent a junction of the finger with the stem 26, as shown in FIGS. 2 and 3, and located closely adjacent the solder perform 12 to preclude flow of solder from the melted preform along the contact finger during a soldering operation and to direct flow of the molten solder over the sides of the contact finger of gravity.

As a result, when the solder preform 12 reaches a molten state in a soldering operation, as soon as the surface tension of the molten solder is reduced sufficiently by associated flux to permit flow of the solder, the opposite end portions of the preform flow directly over the opposite sides of the contact finger by gravity down to the contact pad 14 with an "avalanche" effect to form a soldered connection 24 between the lead 10 and the contact pad. Accordingly, the solder cycle time required to form the soldered connection 24 is reduced by on the order of one-half in comparison to one of the solder-bearing leads 10 having no solder stops, or having solder stops located on a stem 26 of the lead as disclosed in the copending application Ser. No. 231,568, assigned to the same assignee as the subject application and filed on even date herewith in the name of C. J. Milora. In addition, as a result of the molten solder from the solder preform 12 flowing directly down onto the contact pad 14 to form the soldered connection 24, the soldered connection can be satisfactorily formed using a solder preform of a flux-bearing type without any significant supplemental fluxing.

More specifically, each solder-bearing lead 10 may include a set of three resilient spring clamping fingers, consisting of the central contact finger 18 and two outer fingers 28, projecting from an enlarged end portion of the lead stem 26. The central contact finger 18 includes a first portion 30, which projects essentially perpendicularly from the enlarged end portion of the stem 26 and which is spaced from essentially opposed parallel portions 32 of the two outer fingers 28. The opposed spring finger portions 30 and 32 define a gap 34 (FIG. 2) in which the substrate circuit device 16 is receivable with a slight force-fit for mounting the lead 10 on the substrate circuit device with a planar inner surface of the central contact finger 18 in firm engagement with a respective one of the contact pads 14. Another portion 36 of the central contact finger 18 is mechanically wrapped around the solder preform 12 to attach the solder preform to an outer opposite surface of the central contact finger.

To reduce the possibility of molten solder from bridging across the solder flow-control stop 20 and then "wicking" up the stem 26 of the lead 10, the stop may extend onto a portion of the stem as shown in FIGS. 1, 2 and 3. Each of the clamping fingers 28 of the lead 10 also may have solder flow-control stops 38 and 40 formed on opposite surfaces thereof adjacent junctions of the fingers with the stem 26, as shown in FIGS. 2 and 3, with at least the stops 38, which are located on surfaces of the clamping fingers facing in the direction of the solder preforms 12, extending onto portions of the lead stem 26 to reduce the possibility of molten solder from bridging across these stops and "wicking" up the stem.

The stems 26 and the resilient clamping fingers 18 and 28 of the leads 10 are formed of a base metal, such as phosphor bronze, which is not readily wetted by solder when oxidized as a result of exposure to the atmosphere, and which is coated on opposite surfaces thereof with thin coatings 42 and 44 (magnified in thickness in FIGS. 2 and 3 for purposes of illustration) of a metal which is readily wetted by solder, such as tin. The tin coatings 42 and 44, which may be on the order of 0.2–0.5 mils thick, facilitate the making of electrical soldered connections (such as the soldered connections 24) to the leads 10. The stems 26 of the leads 10 also are formed integrally connected to an elongated continuous apertured support rail 48 (FIG. 1) which subsequently is clipped from the stems after the leads 10 have been mounted on the substrate circuit device 16 and soldered to their respective contact pads 14 as shown in FIG. 3.

The solder preforms 12 may each consist of an essentially cylindrical piece of a relatively malleable solder wire, such as a 60-40 tin-lead alloy. Preferably, however, the solder preforms 12 are of a flux-bearing type suitable for use in a progressive punch-and-die, such as the number 2879 rosin core solder available from the Alpha Metals Company of Newark, N.J., so as to eliminate or reduce the amount of supplemental spray fluxing required in the soldering of the leads 10.

As a result of the manner in which the solder-bearing leads 10 are fabricated from a tin-coated phosphor bronze strip (not shown) in a progressive punch-and-die as above described, when each lead is mounted on the substrate circuit device 16 the portion of the solder preform 12 held by the central contact finger 18 of the lead is separated from the contact pad 14 with which the central contact finger is engaged, by oxidized phosphor bronze base metal side portions of the contact finger which are not readily wetted by solder. As a result, solder from the melted preform 12 in a soldering operation normally tends to flow along the solder-wettable tin coating 42 of the lead on the contact finger 18 to the lead stem 28, and then up the lead stem by a "wicking" action. In each of the disclosed leads 10 in accordance with this invention, however, the molten solder of the preform 12 is essentially precluded from flowing along the tin coating 42 on the central contact finger 18 by the first solder flow-control stop 20, thus forcing the melted solder to flow directly across the thickness of the finger by gravity to the contact pad 14 as soon as the preform becomes molten and its associated flux has reduced its surface tension so as to permit flow of the solder, as noted hereinabove. The molten solder then also is essentially confined on the contact pad 14 and precluded from flowing away from the contact pad along the tin coating 44 on the contact finger 18, by the second solder flow-control stop 22, and subsequently resolidifies to form the soldered connection 24 as illustrated in FIG. 3.

The solder flow-control stops 20, 22, 38 and 40 may be formed on the leads 10 by removing bands of the tin coatings 42 and 44, respectively, to expose the underlying phosphor-bronze base metal. The removal of the bands of the tin coatings 42 and 44 may be accomplished, by way of example, by advancing the above-mentioned strip of tin-coated stock (not shown) from which the leads 10 are formed, through a fixed skiving or scraping tool (not shown) prior to forming the leads in the above-mentioned progressive punch-and-die (not shown). Then, as the exposed portions of the phosphor bronze metal subsequently oxidize as a result of exposure to the atmosphere, they form the solder flow-control stops 20, 22, 38 and 40, which are not readily wetted by solder. In the alternative, the solder flow-control stops 20, 22, 38 and 40 also may be formed in other manners, such as by electroplating on the phosphor-bronze base metal, applying organic coating material on the base metal, or otherwise forming a solder-nonwettable band on the strip of stock material prior to forming the leads in the progressive punch-and-die.

In summary, a new and improved solder-bearing lead, such as the lead 10, has been disclosed. With reference to the lead 10, the solder flow-control stops 20, 22, 38 and 40 are formed by oxidized portions of the solder-nonwettable base metal of the lead, from which portions of the solder-wettable coatings 42 and 44 have been removed, respectively. The solder flow-control stop 20 on the contact finger 18 essentially precludes flow of molten solder from the solder preform 12 along the adjacent surface of the contact finger during a soldering operation, and thus forces the molten solder to flow directly across the thickness of the contact finger onto a respective one of the contact pads 14 of the substrate circuit device 16. The second solder flow-control stop 22 on the contact finger 18 then essentially precludes flow of molten solder from the contact pad 14 along the opposite surface of the contact finger, thus cooperating with the solder flow-control stop 20 in the forming of the soldered connection 24. During the soldering operation, the solder flow-control stops 38 and 40 on the outer spring fingers 28 also help to preclude flow of molten solder along these fingers to the lead stem 26. As a net result, the time required to solder the leads 10 is substantially reduced in comparison to prior known leads, and where the solder preforms 12 are of a flux-bearing type the need for supplemental fluxing in addition to that provided by the preforms is essentially eliminated.

What is claimed is:

1. A solder-bearing lead, which comprises:
   an elongated stem having a solderable portion on at least one surface of the stem;
   first and second resilient clamping fingers extending in opposed spaced relationship from the elongated stem to define a gap for the reception of a substrate therebetween, the first resilient clamping finger defining an electrical contact finger having opposite sides, a first surface for engaging a contact pad on the substrate, and a second opposite surface, the second surface forming a continuation of the one surface of the stem and also having a solderable portion;
   a solder preform attached to the solderable portion of the second surface of the electrical contact finger; and
   a solder flow-control stop on the second surface of the electrical contact finger closely adjacent the solder preform for precluding flow of molten solder from the solder preform along the second surface of the contact finger to the stem during a soldering operation, and for directing flow of the molten solder essentially directly over at least one of the opposite sides of the contact finger by gravity to the contact pad engaged by the first surface of the contact finger.

2. A solder-bearing lead as recited in claim 1, in which:
the stem of the lead and the resilient clamping fingers are formed by a base metal which tends to oxidize upon exposure to the atmosphere so as to become resistant to solder; and
the solder flow-control stop on the second surface of the electrical contact finger is formed by an oxidized portion of the base metal.

3. A solder-bearing lead as recited in claim 1, which further comprises:
a surface on the second resilient clamping finger facing in the direction of the solder preform on the electrical contact finger and forming a continuation of the one surface of the stem; and
a solder flow-control stop formed on the surface of the second resilient clamping finger for precluding flow of molten solder along the surface during a soldering operation.

4. A solder-bearing lead as recited in claim 1, in which:
the solder preform is a flux-bearing type solder preform.

5. A solder-bearing lead as recited in claim 4, in which:
the flux-bearing solder preform is a flux-core type solder preform.

6. A solder-bearing lead as recited in claim 1, in which:
the elongated stem has a solderable portion on a second surface of the stem;
the first surface of the electrical contact finger forms a continuation of the second surface of the stem and has a solderable portion for engaging the contact pad on the substrate; and
a second solder flow-control stop is formed on the lead adjacent a junction of the first surface of the electrical contact finger with the stem for precluding flow of molten solder along the stem from the first surface of the contact finger during a soldering operation.

7. A solder-bearing lead as recited in claim 6, in which:
the stem of the lead and the resilient clamping fingers are formed by a base metal which tends to oxidize upon exposure to the atmosphere so as to become resistant to solder; and
each of the solder flow-control stops is defined by an oxidized portion of the base metal.

8. A solder-bearing lead as recited in claim 6, which further comprises:
solder flow-control stops formed on the lead adjacent junctions of respective opposite surfaces of the second resilient clamping finger with the stem for precluding flow of molten solder along the stem during a soldering operation, the opposite surfaces of the second resilient clamping finger forming continuations of the first and second surfaces of the stem, respectively.

9. A solder-bearing lead as recited in claim 6, in which:
the solder preform is a flux-core type solder preform.

10. A solder-bearing lead as recited in claim 9, in which:
the electrical contact finger extends about at least a portion of the flux-core type solder preform in clamping relationship;
the stem of the lead and the resilient clamping fingers are formed by a base metal which tends to oxidize upon exposure to the atmosphere so as to become resistant to solder, and which is coated on opposite sides thereof with metal coatings which are readily wetted by solder;
the solder-flow control stops are formed by oxidized portions of the base metal from which the respective metal coatings have been removed; and
solder flow-control stops are formed on the lead adjacent junctions of respective opposite surfaces of the second resilient clamping finger with the stem by oxidized portions of the base metal from which the respective metal coatings have been removed, for precluding flow of molten solder along the stem during a soldering operation, the opposite surfaces of the second resilient clamping finger forming continuations of the first and second surfaces of the stem, respectively.

* * * * *